US006847572B2

United States Patent
Lee et al.

(10) Patent No.: US 6,847,572 B2
(45) Date of Patent: Jan. 25, 2005

(54) REFRESH CONTROL CIRCUIT AND METHODS OF OPERATION AND CONTROL OF THE REFRESH CONTROL CIRCUIT

(75) Inventors: Hyun-Suk Lee, Seoul (KR); Kyung-Woo Nam, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/421,739

(22) Filed: Apr. 24, 2003

(65) Prior Publication Data

US 2004/0008558 A1 Jan. 15, 2004

(30) Foreign Application Priority Data

Jul. 12, 2002 (KR) .................................. 2002-0040593

(51) Int. Cl.[7] ............................................. G11C 7/00
(52) U.S. Cl. ...................... 365/222; 365/194; 365/195
(58) Field of Search ............................ 365/222, 194, 365/195

(56) References Cited

U.S. PATENT DOCUMENTS 5,617,551 A * 4/1997 Corder .......................... 711/1
6,275,437 B1 * 8/2001 Kim et al. .................. 365/222

* cited by examiner

*Primary Examiner*—Vu A. Le
(74) *Attorney, Agent, or Firm*—Harness Dickey

(57) ABSTRACT

A refresh operation in a PSRAM device to hidden-refresh an internal memory cell by using a refresh pulse signal may be controlled by forming a dummy duration for the refresh operation in a read/write cycle, reducing the dummy duration when the refresh pulse signal is not generated, and delaying the read/write cycle until the refresh operation is completed, when the refresh pulse signal is generated. The dummy duration may be reduced by a given amount during a period in which the refresh operation is not being performed, while the dummy duration may be increased in period of time subject to the refresh operation.

23 Claims, 5 Drawing Sheets

REFRESH CONTROL CIRCUIT AND METHODS OF OPERATION AND CONTROL OF THE REFRESH CONTROL CIRCUIT

This U.S. nonprovisional patent application claims priority under 35 U.S.C. §119 of Korean Patent Application 2002-40593, filed on Jul. 12, 2002, the entire contents of which is hereby incorporated by reference.

BACKGROUND OF THE INVENTION

1. Field of the Invention

The present invention relates to a refresh control circuit of a semiconductor device and methods of operation and control for the refresh control circuit.

2. Description of the Related Art

A pseudo static random access memory (PSRAM) internally uses a cell structure of a dynamic random access memory (DRAM), and is externally similar to a static random access memory (SRAM). A cell structure of a PSRAM includes a unit transistor and a unit capacitor, like the DRAM, and is thus termed a unit transistor random access memory (UtRAM). In these memory structures, a refresh operation is typically needed to prevent a loss of data stored in memory cells. The PSRAM includes an internal refresh oscillator to perform a refresh operation at a constant period, and may automatically perform a hidden refresh by using a refresh control pulse generated in the refresh oscillator.

When a read/write command is externally input to the PSRAM to perform a read/write operation, while a memory cell is being refreshed with the internal refresh oscillator, data of the memory cell cannot be guaranteed to execute the read/write operation. That is why a controller at the exterior of the PSRAM cannot acknowledge when a refresh operation within a memory chip is to be performed.

FIG. 1 is a timing diagram of a dummy duration for a refresh operation in a prior art PSRAM. To solve the above-described problem in a prior art PSRAM, a dummy duration during which the refresh operation may be performed is unconditionally guaranteed within a read/write cycle, and the external read/write command is performed. In FIG. 1, the dummy duration is determined as, and may be referred to as a time "trc". The trc is a time that should guarantee a time (e.g., span a time period) of "word line enable+bit line charge sharing+cell data restore+word line disable+bit line precharge". Thus, the prior art PSRAM performs the read/write operation regardless of an internal refresh operation, because a dummy duration for a refresh operation in the typical PSRAM is always guaranteed within the read/write cycle.

In FIG. 1, "addr" indicates an address, "WL" represents a word line, and "DQ" represents output of data. The time "tRC" represents a read cycle time, "tAA" represents an address access time, and "taa" represents a duration of time from a time enabled to a word line until an output time of data.

FIG. 2 illustrates a circuit diagram of a refresh concern signal generating circuit in a prior art PSRAM. Referring to FIG. 2, a refresh signal generating circuit 200 includes an address transition detector (ATD) 210 for sensing a transition of an address signal addr inputted from an exterior of a PSRAM chip, and for generating an address sense pulse. A dummy duration determination part 212 may extend, by a given delay time, the address sense pulse so as to output a dummy control pulse (PUL). An automatic pulse generator (hereinafter, referred to as "pulse generator") 214 may automatically generate a delayed dummy control pulse (PULP) when the PUL is disabled.

Refresh signal generating circuit may also include a word line control pulse generator 216 for outputting a pulse obtained by merging the pulse generated when PUL is disabled, with the PUL. This merged pulse may be embodied as a word line activation control signal (NERFH). A refresh control signal generator 220 may generate a refresh control signal (SRFHP) in response to a refresh pulse (SRFH) that is output with a given period from an internal refresh oscillator 218. The refresh control signal generator 220 may cut off an output of SRFHP in response to the NERFH. A word line selection circuit 222 may output a word line during a given time, in response to the PULP and the SRFHP.

The SRFH output from the internal refresh oscillator 218 may be provided to a refresh address counter (not shown), so as to perform a refresh operation of the memory cell. The dummy duration determination part 212 may include inverters 224 and 226 (connected in series) and NOR gate 228, for generating a pulse having a constant duration (dummy duration) by performing a negative logical sum of the ATD pulse, which is supplied to an input terminal of inverter 224 and an output of inverter 226, as shown in FIG. 2.

The pulse generator 214 may be embodied as an automatic pulse generator that includes an inverter 232 and a NOR gate 234. The word line control pulse generator 216 may include inverters 236, 237, 238 and 242 and two NOR gates 241 and 242. The word line control pulse generator 216 outputs a pulse having an extended duration by merging a pulse generated when PUL is disabled with the PUL, for example.

The refresh control signal generator 220 may be embodied as a an automatic pulse generator including an inverter 244, NOR gate 246 and RS flip-flop 248. RS flip-flop 248 may be set by an output of the NOR gate 246 and reset by the NERFH. Refresh control signal generator 220 further includes inverter 250 for inverting an output of the RS flip-flop 248 to output the refresh control signal SRFHP.

The word line selection circuit 222 may include a NOR gate 52 for performing a negative logical sum of the PULP and the SRFHP, inverters 254, 256, 258, 262 and a NOR gate 260. In other words, the word line selection circuit 222 may be a pulse extender for extending, by a constant time, an output of the inverter 254, and then outputting a word line (WL).

Operations of the refresh concern signal generating circuit in the general PSRAM of FIG. 2 may be described referring to the timing diagrams of FIGS. 3 through 5. When the read/write address signal addr is input to ATD 210 and the ATD pulse is output therefrom, a duration of the ATD pulse may be extended by inverters 224, 226 and NOR gate 228 within the dummy duration determination part 212 of FIG. 2. The ATD pulse is output as the dummy control pulse PUL. At this time, delay through inverters 224, 226 and the NOR gate 228 may represent a dummy duration, as shown in FIG. 3. When the PUL is delayed by the pulse generator 214 and is generated as the delayed dummy control pulse PULP, a word line may be activated by the word line selection circuit 222, as shown in FIG. 3.

When the SRFH of a "low" state is generated from the internal refresh oscillator 218, such that the dummy duration is determined every read/write cycle, the RS flip-flop 248 is set, enabling word line selection circuit 222. At this time, cells within a memory cell array are refreshed by a refresh address counter operation, upon receipt of the SRFH. The RS flip-flop 248 is reset by the NERFH output from the word line control pulse generator 216. Thus, in a case where the prior art refresh control circuit 200 of FIG. 2 executes a refresh operation at a minimum tRC, the circuit 200 operates as illustrated by the timing diagram of FIG. 4. In FIG. 4, a tRC(read cycle time) is essentially equal to a tAA(address access time) in the prior art SRAM, therefore the tRC based on the circuit of FIG. 2 may be determined as 2trc(tRC= 2trc).

A skew free operation is a function supported in an PSRAM. A skew free operation may be understood as an operation of ignoring a precedent arriving read/write command when two or more read/write commands are successively received by the PSRAM, in a time period in which a minimum tRC is smaller than a dummy duration trc, such as is shown in FIG. 5. When consecutive read/write commands are received internally in the PSRAM, within a time period that is smaller than a trc duration, the preceding (i.e., first) read/write commands are ignored and not performed, so as to sufficiently guarantee the trc duration.

SUMMARY OF THE INVENTION

An exemplary embodiment of the present invention is directed to a refresh control circuit in a pseudo static random access memory (PSRAM) device, and a control method for the refresh control circuit. The refresh control circuit may include a detector detecting an address signal and generating a detection pulse in response to the detected address signal. A first control signal generator in the refresh control circuit may generate a dummy control pulse for determining a dummy duration of a refresh operation, and a second control signal generator may generate a refresh control signal and cut off output of the refresh control signal. The refresh control circuit may further include a selection circuit that may generate a selection signal at a first time, in response to the dummy control pulse and refresh control signal, and that may generate a dummy duration guarantee pulse at a second time.

Another exemplary embodiment of the present invention is directed to a method of controlling a refresh operation of a PSRAM device that receives a refresh pulse signal with a given period from a refresh pulse generator in order to perform a hidden-refresh of an internal memory cell, where a dummy duration may be formed for the refresh operation in a read/write cycle. The dummy duration for the refresh operation may be reduced when the refresh pulse signal is not generated, and the read/write cycle may be delayed until the refresh operation is completed, when the refresh pulse signal is generated.

Another exemplary embodiment of the present invention is directed to a method of controlling a refresh operation in a refresh control circuit of a PSRAM device. The refresh control circuit receives a refresh pulse signal with a given period from a refresh pulse generator in order to perform a hidden-refresh of an internal memory cell. A dummy duration for the refresh operation in a read/write cycle may be varied based on a set/reset time point of an RS flip-flop in the refresh control circuit.

BRIEF DESCRIPTION OF THE DRAWINGS

Exemplary embodiments of the present invention will become more fully understood from the detailed description given hereinbelow and the accompanying drawings, wherein like elements are represented by like reference numerals, which are given by way of illustration only and thus are not limitative of the exemplary embodiments of the present invention and wherein.

DETAILED DESCRIPTION OF THE EXEMPLARY EMBODIMENTS

Hereinafter, exemplary embodiments of the present invention will be described in detail with reference to FIGS. 6 to 11. The elements described in FIGS. 6–11 in accordance with the exemplary embodiments of the present, invention are similar to those described with respect to the PSRAM device of FIGS. 1 through 5, and therefore a detailed description thereof will be generally limited to the differences for the sake of brevity.

Figure 6:
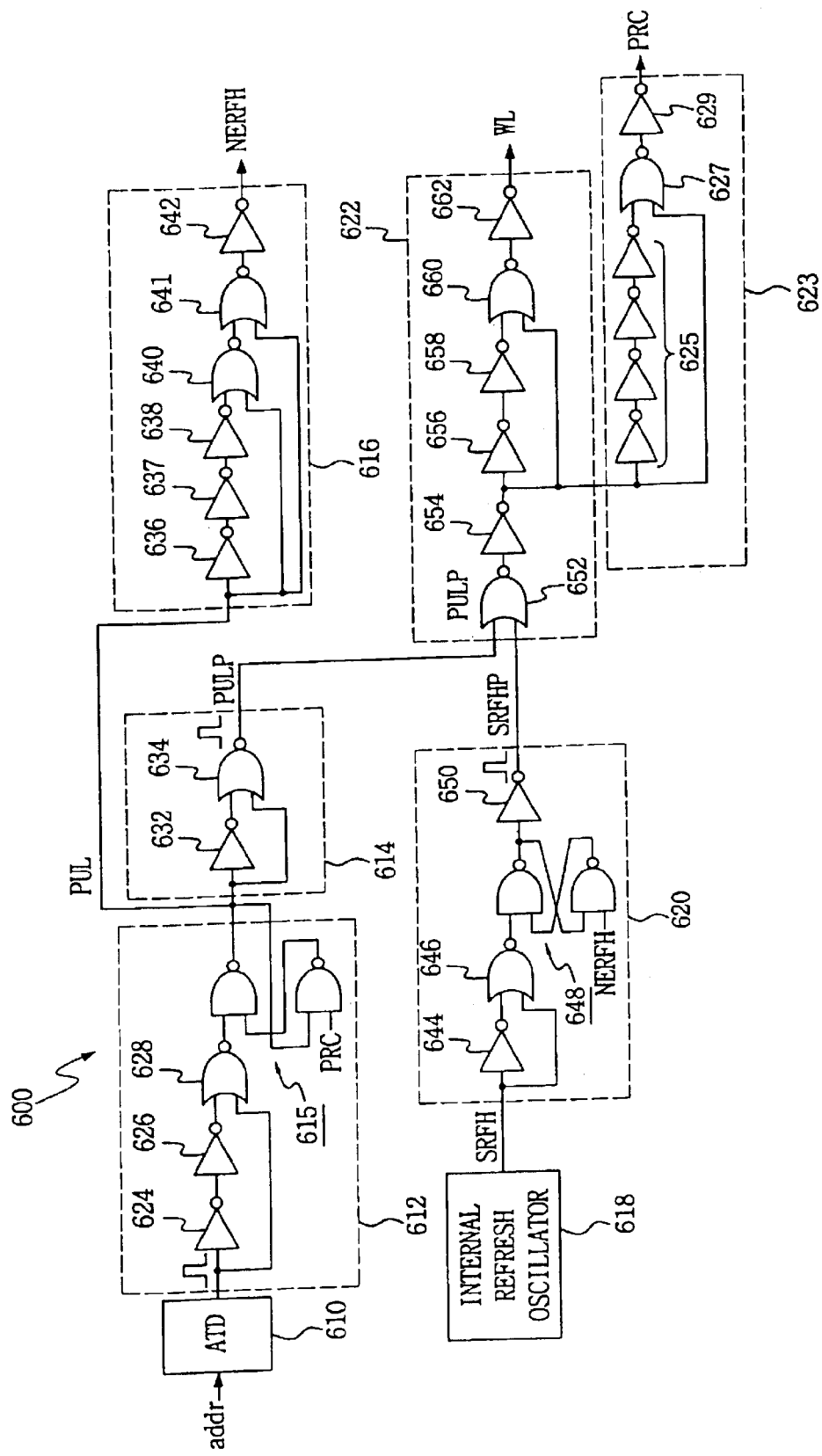
FIG. 6 is a circuit diagram of a refresh control circuit in a PSRAM in accordance with an exemplary embodiment of the present invention.

FIG. 6 is a circuit diagram of a refresh control circuit in a PSRAM in accordance with an exemplary embodiment of the present invention. In refresh control circuit 600, a dummy duration determination part 612 may further include an RS flip-flop 615 connected between a NOR gate 628 and an inverter 632 of a pulse generator 614, as shown in FIG. 6.

An output node of an inverter 654 in a word line selection circuit 622 may be further connected to a dummy duration guarantee pulse generator 623. The dummy duration guarantee pulse generator 623 may include an inverter chain 625, a NOR gate 627 for performing a negative logical sum of an output of the inverter chain 625 and an output of the inverter 654, and an inverter 629 for inverting an output of the NOR gate 627 to output a dummy duration guarantee pulse PRC. Namely, the PRC may represent a pulse guaranteeing a trc.

Operations of the refresh control circuit 600 will be described as follows, with reference to timing diagrams in FIGS. 7 to 11. These figures should be observed with occasional reference to FIG. 6.

Figure 1:
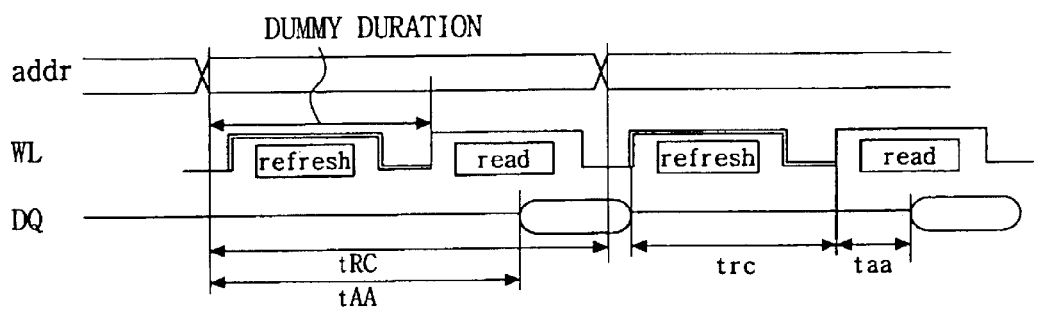
FIG. 1 is a timing diagram of a dummy duration for a refresh operation in a prior art PSRAM.
Figure 3:
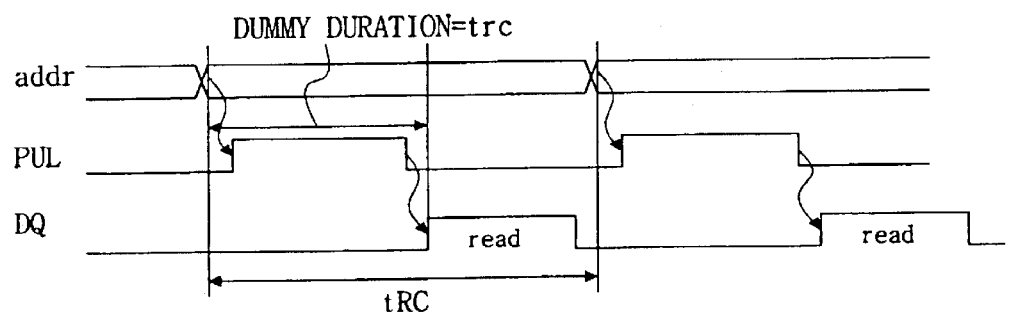
FIG. 3 is a timing drawing illustrating a generation of a dummy control pulse for determining a dummy duration at a minimum read cycle time according to the construction of FIG. 2.
Figure 4:
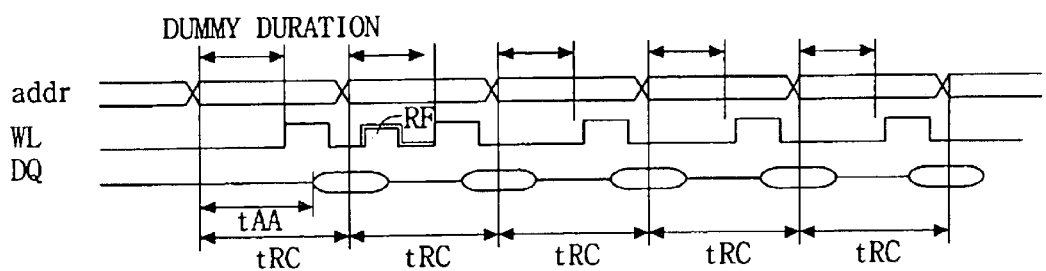
FIG. 4 is a refresh timing diagram at a minimum read cycle time according to the circuit of FIG. 2.
Figure 2:
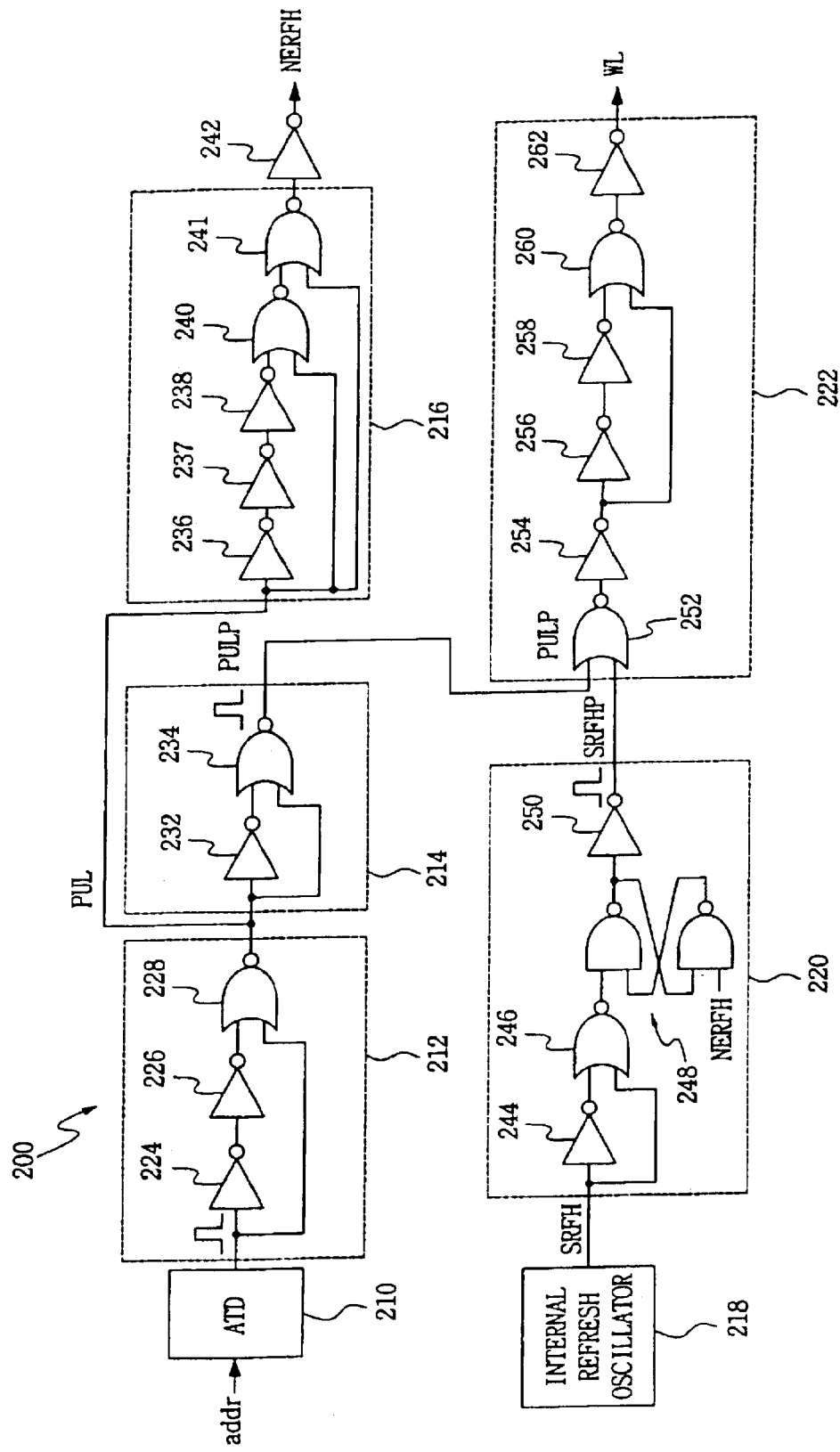
FIG. 2 is a circuit diagram showing a generation of refresh concern signals in the prior art PSRAM.
Figure 5:
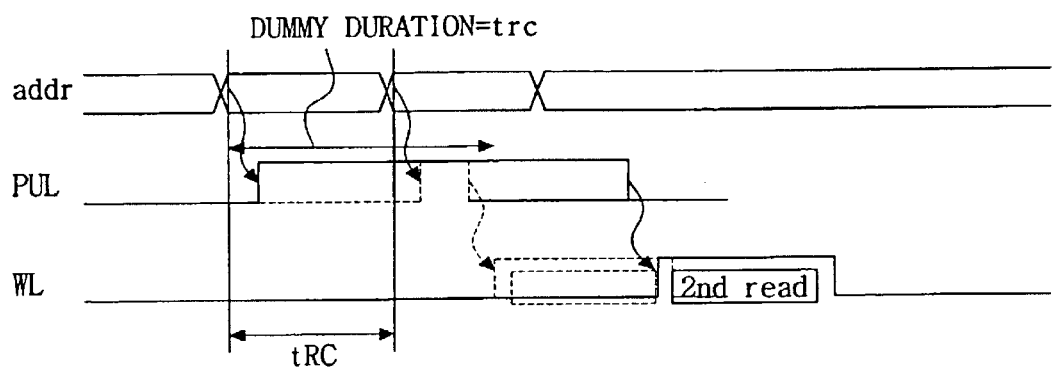
FIG. 5 is a diagram showing a skew free state according to the circuit of FIG. 2.
Figure 7:
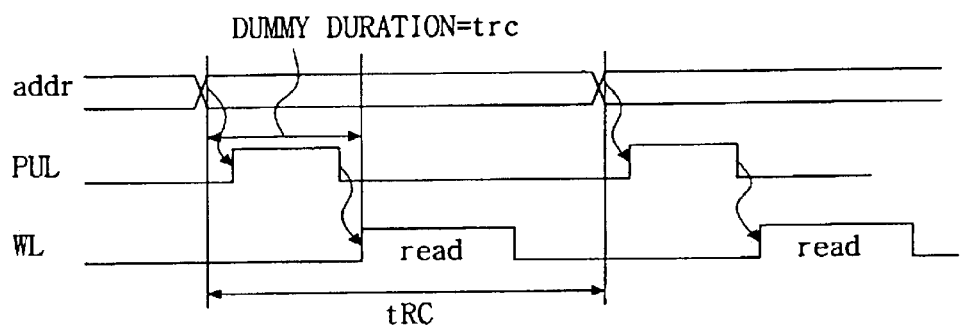
FIG. 7 is a diagram showing a generation correlation of a variable dummy control pulse at a minimum read cycle time in accordance with an exemplary embodiment of the invention.

FIG. 7 is a diagram showing a generation correlation of a variable dummy control pulse at a minimum read cycle time in accordance with an exemplary embodiment of the invention. When a read/write address signal (addr) is input to address transition detector (ATD) 610 and an ATD pulse is output from ATD 610, a duration of the ATD pulse may be extended by inverters 624, 626 and by NOR gate 628 of dummy duration determination part 612. An output of the NOR gate 628 may set the RS flip-flop 615, generating dummy control pulse PUL, as shown in FIG. 7, for example. The PUL may be delayed by pulse generator 614, to generate a delayed dummy control pulse PULP. At this time, a word line may be activated by word line selection circuit 622, as shown in FIG. 7, for example. Additionally at this time, an output of the inverter 654 may be provided to dummy duration guarantee pulse generator 623, to reset RS flip-flop 615 and cut off output of the PUL.

Therefore, a dummy duration in refresh control circuit 600 may be varied according to a set/reset time point of the RS flip-flop 615 in the dummy duration determination part 612. Accordingly, in a case where a read/write cycle period may progress at a substantially high speed, such as processing speeds typically observed in non-volatile memory devices such as PSRAMs, DRAMs, etc., the dummy duration may be reduced to a duration that is less than a duration (or period) of a trc.

Figure 8:
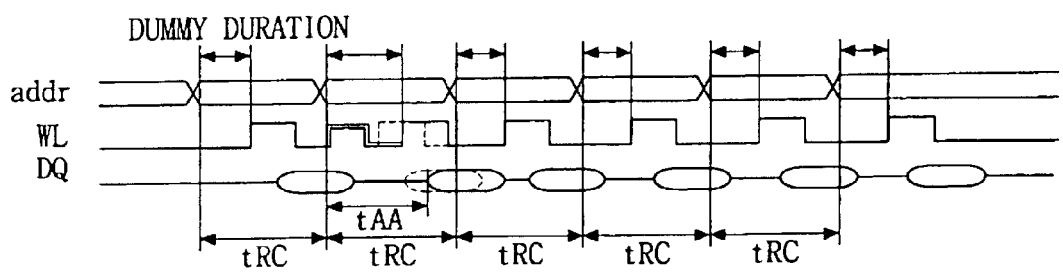
FIG. 8 is a refresh timing diagram at a minimum read cycle time of FIG. 6 in accordance with an exemplary embodiment of the invention.

FIG. 8 is a refresh timing diagram at a minimum read cycle time of FIG. 6 in accordance with an exemplary embodiment of the invention. In a prior art PSRAM, a tRC(read cycle time) becomes equal to an rAA(address access time), and as tRC=tAA, tRC equals twice the trc (2trc). However, according to the exemplary embodiments of the present invention, the above relation between tRC, trc and taa may be represented as 2tRC=3trc+taa. This indicates that a time period of the read cycle spans from an activation of a word line to an output of data. Therefore, a tRC may be enhanced by about "(trc-taa)/2" as shown in FIG. 8, as compared to the timing diagram of a dummy duration for a refresh operation in a prior art PSRAM of FIG. 1.

Figure 9:
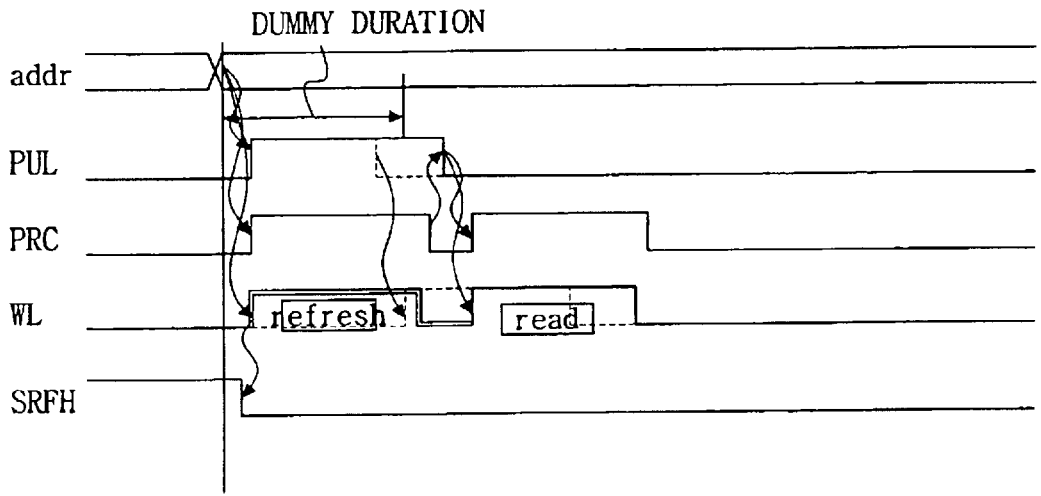
FIG. 9 is an operation timing diagram of FIG. 6 in accordance with an exemplary embodiment of the invention.

FIG. 9 is an operation timing diagram of FIG. 6 in accordance with an exemplary embodiment of the invention. FIG. 9 illustrates a timing that is sufficient enough to guarantee a dummy duration, when a refresh operation is performed.

If the dummy duration is reduced as mentioned above, problems related to skew free may arise. However, the exemplary embodiments of the prevent invention may be configured so as not to merge two dummy control pulses (2 PULs), in a case where a read/write cycle is smaller than the trc, but larger than the dummy duration. In accordance with the exemplary embodiments of the present invention, the dummy duration may be reduced to a duration that is less than a duration (or period) of a trc.

Figure 10:
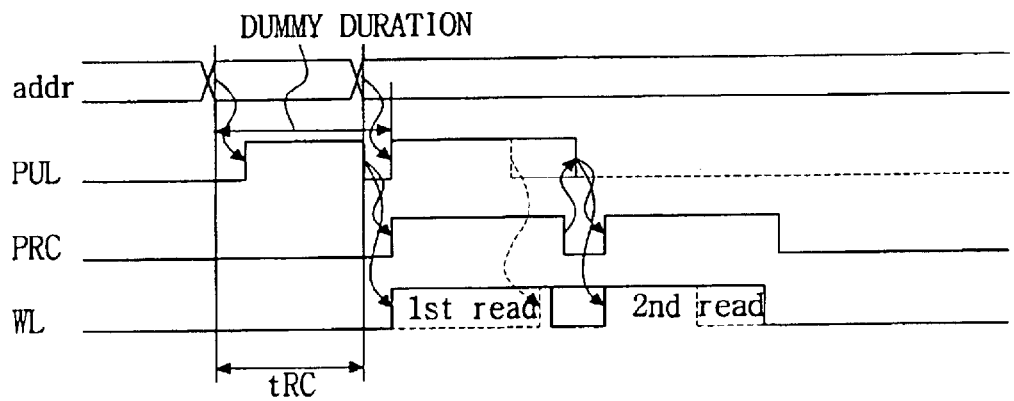
FIG. 10 is a timing diagram showing a skew free operation in FIG. 6, in accordance with an exemplary embodiment of the invention.

FIG. 10 is a timing diagram showing a skew free operation in FIG. 6, in accordance with an exemplary embodiment of the invention. As shown in FIG. 10, and without ignoring a preceding read/write, a second read/write (e.g., a second of two or more consecutive read/write commands) may be delayed sufficiently so as to guarantee a trc of the first read/write. In this case, e.g., where a read/write is performed consecutively and repetitively, a consecutive accumulation of time points may arise. However, the exemplary embodiments of the present invention may be designed to delay a disable time point of the dummy control pulse PUL. In other words, the PUL may be delayed until a time point when the RS flip-flop 615 is reset by the PRC output from the dummy duration guarantee pulse generator 623.

Figure 11:
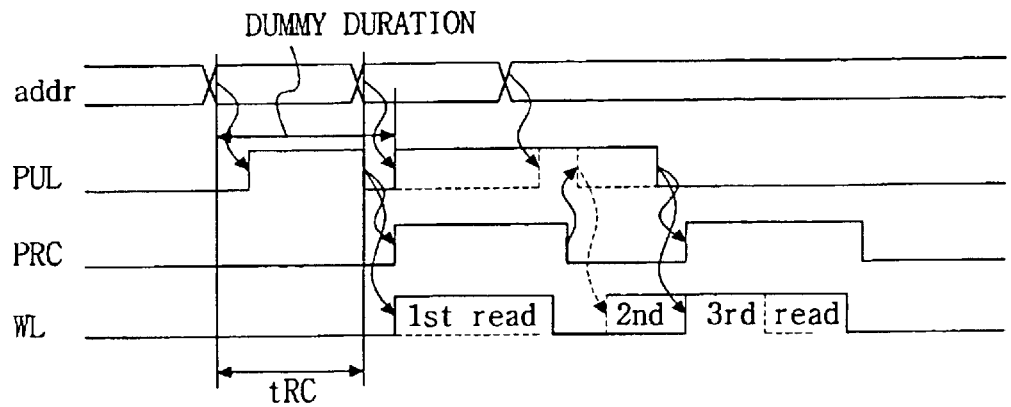
FIG. 11 is a timing drawing showing a skew free operation of FIG. 6 in accordance with an exemplary embodiment of the invention.

FIG. 11 is a timing drawing showing a skew free operation of FIG. 6 in accordance with an exemplary embodiment of the invention. The timing diagram in FIG. 11 illustrates operations occurring when read addresses smaller than the dummy duration are inputted three consecutive times to refresh control circuit 600. Referring to FIG. 11, a second read may be delayed sufficiently to guarantee a trc of a first read, but a third read may be merged with a second dummy control pulse PUL, so as to be ignored without a delay. Accordingly, the refresh control circuit 600 may operate so as to guarantee a trc by delaying the dummy control pulse PUL, even where a read command is input during a skew free operation.

Accordingly, the exemplary embodiments of the present invention may provide a pseudo static random access memory (PSRAM) device having high-speed access capabilities, and which may be able to adaptively vary a dummy duration for a refresh operation adaptively to a read/write cycle. Further, the exemplary embodiments of the present invention may shorten a read/write cycle time so as to access to data at a substantially high speed. In a time period where no refresh operation is performed, this may be accomplished by reducing a dummy duration for a refresh operation. In a time period, where a refresh operation is performed, this may be accomplished by delaying the dummy duration.

Although the exemplary embodiments of the present invention have been described in terms of a PSRAM, the present invention is not so limited. The exemplary embodiment s may be adapted to any non-volatile memory device, such as a DRAM, DDR RAM, VRAM, SDRAM, etc.

The exemplary embodiments of the present invention being thus described, it will be obvious that the same may be varied in many ways. Such variations are not to be regarded as a departure and scope of the exemplary embodiments of the present invention, and all such modifications as would be obvious to one skilled in the art are intended to be included within the scope of the following claims.

What is claimed is:

1. A refresh control circuit in a pseudo static random access memory (PSRAM) device, comprising:
   a detector detecting an address signal and generating a detection pulse in response thereto;
   a first control signal generator generating a dummy control pulse for determining a dummy duration of a refresh operation;
   a second control signal generator generating a refresh control signal and cutting off an output of the refresh control signal; and
   a selection circuit generating a selection signal at a first time in response to the dummy control pulse and refresh control signal, and generating a dummy duration guarantee pulse at a second time.

2. The circuit of claim 1, wherein the first control signal generator further includes:
   a dummy duration determination part delaying, by a given delay time, the detection pulse, and outputting the delayed signal as the dummy control pulse in response to input of the dummy duration guarantee pulse;
   a pulse generator automatically generating a delayed dummy control pulse in response to an input of the dummy control pulse; and
   a word line control pulse generator outputting the word line activation control signal in response to input of the delayed dummy control pulse.

3. The circuit of claim 2, wherein said dummy duration determination part further includes:

at least one or more delays delaying the detection pulse;

a gate logically combining input and output signals of the delays, and outputting the delayed detection pulse; and a flip-flop generating the dummy control pulse to determine the dummy duration.

4. The circuit of claim 1, wherein the circuit performs a hidden-refresh operation of an internal memory cell by using a refresh pulse signal output with a given period from a refresh pulse generator.

5. The circuit of claim 4, wherein the first signal generator further generates a word line activation control signal that is enabled during the dummy duration and during a word line activation duration, in response to an input of the detection pulse and the dummy duration guarantee pulse.

6. The circuit of claim 5, wherein the second control signal generator generates the refresh control signal in response to the refresh pulse signal, and cuts off in response to the word line activation control signal.

7. The circuit of claim 4, wherein the selection signal enables selection of a word line of the internal memory cell.

8. The circuit of claim 4, wherein the dummy duration guarantee pulse is generated simultaneously with the selection signal and input to the first control signal generator to generate the word line activation control signal.

9. The circuit of claim 1, wherein the second time is larger than the first time.

10. The circuit of claim 3, wherein the flip-flop is set by an output of the gate and reset by an input of the dummy duration guarantee pulse.

11. A method of controlling a refresh operation of a PSRAM device that receives a refresh pulse signal with a given period from a refresh pulse generator in order to perform a hidden-refresh of an internal memory cell, comprising:

forming a dummy duration for the refresh operation in a read/write cycle; and reducing the dummy duration for the refresh operation when the refresh pulse signal is not generated, else delaying the read/write cycle until the refresh operation is completed.

12. The method of claim 11, wherein said delaying increases the dummy duration to reduce a minimum read/write cycle time.

13. A method of operating a refresh control circuit in a pseudo static random access memory (PSRAM) device receiving a refresh pulse signal, comprising:

detecting an address signal;

generating a detection pulse in response to said detected address signal;

generating a dummy control pulse for determining a dummy duration for a refresh operation;

generating a refresh control signal in response to-the refresh pulse signal;

cutting off output of the refresh control signal based on another control signal;

generating a selection signal at a first time in response to the dummy control pulse and refresh control signal; and generating a dummy duration guarantee pulse at a second time.

14. The method of claim 13, further comprising:

receiving the refresh pulse signal with a given period from a refresh pulse generator to perform a hidden-refresh operation of an internal memory cell by using.

15. The method of claim 14, further comprising:

generating a word line activation control signal that is enabled during the dummy duration and during a word line activation duration, in response to an input of the detection pulse and the dummy duration guarantee pulse.

16. The method of claim 15, wherein said cutting further includes cutting off output of the refresh control signal in response to the word line activation control signal.

17. The method of claim 14, wherein said selection signal enables selection of a word line of the internal memory cell.

18. The method of claim 14, wherein the dummy duration guarantee pulse is generated simultaneously with the selection signal and used in generating the word line activation control signal.

19. The method of claim 13, wherein the second time is larger than the first time.

20. A method of controlling a refresh operation in a refresh control circuit of a PSRAM device that receives a refresh pulse signal with a given period from a refresh pulse generator in order to perform a hidden-refresh of an internal memory cell, comprising:

varying a dummy duration for the refresh operation in a read/write cycle based on a set/reset time point of an RS flip-flop in the refresh control circuit.

21. A refresh control circuit in a pseudo static random access memory (PSRAM) device having a refresh operation that is controlled based on the method of claim 11.

22. A refresh control circuit in a pseudo static random access memory (PSRAM) device having a refresh operation that is operated based on the method of claim 13.

23. A refresh control circuit in a pseudo static random access memory (PSRAM) device having a refresh operation that is controlled based on the method of claim 20.

* * * * *